United States Patent
Tsai

(10) Patent No.: US 6,713,857 B1
(45) Date of Patent: Mar. 30, 2004

(54) LOW PROFILE STACKED MULTI-CHIP SEMICONDUCTOR PACKAGE WITH CHIP CARRIER HAVING OPENING AND FABRICATION METHOD OF THE SEMICONDUCTOR PACKAGE

(75) Inventor: Chung-Che Tsai, Hsinchu (TW)

(73) Assignee: Ultra Tera Corporation (TW)

( * ) Notice: Subject to any disclaimer, the term of this patent is extended or adjusted under 35 U.S.C. 154(b) by 0 days.

(21) Appl. No.: 10/314,064

(22) Filed: Dec. 5, 2002

(51) Int. Cl.⁷ .............................................. H01L 23/02
(52) U.S. Cl. .................. 257/686; 257/704; 257/777; 257/787
(58) Field of Search ................................ 257/685, 686, 257/701, 704, 737, 738, 784, 773, 774, 777, 787

(56) References Cited

U.S. PATENT DOCUMENTS

| | | | | |
|---|---|---|---|---|
| 5,523,608 A | * | 6/1996 | Kitaoka et al. ............. | 257/433 |
| 6,057,597 A | * | 5/2000 | Farnworth et al. .......... | 257/710 |
| 6,353,257 B1 | * | 3/2002 | Huang ......................... | 257/704 |
| 2002/0113304 A1 | * | 8/2002 | Doh et al. .................... | 257/686 |
| 2002/0130398 A1 | * | 9/2002 | Huang ......................... | 257/666 |
| 2002/0135080 A1 | * | 9/2002 | Bai .............................. | 257/787 |
| 2003/0025199 A1 | * | 2/2003 | Wu et al. ..................... | 257/724 |

* cited by examiner

Primary Examiner—Nathan J. Flynn
Assistant Examiner—Pershelle Greene
(74) Attorney, Agent, or Firm—Anderson Kill & Olick; Eugene Lieberstein; Michael N. Meller

(57) ABSTRACT

A stacked multi-chip semiconductor package and a fabrication method thereof are provided. A chip carrier is formed with an opening for receiving a first chip therein, and a second chip is stacked on the first chip and over the opening, wherein the first and second chips are respectively electrically connected to the chip carrier by bonding wires. A first encapsulant is formed to encapsulate first chip and corresponding bonding wires, and a second encapsulant is formed around the second chip to encompass a cavity for receiving the second chip and corresponding bonding wires therein. A lid is attached to the second encapsulant for covering the cavity. This semiconductor package allows high integration and increase in operational performances by virtue of stacked multi-chip structure.

20 Claims, 3 Drawing Sheets

LOW PROFILE STACKED MULTI-CHIP SEMICONDUCTOR PACKAGE WITH CHIP CARRIER HAVING OPENING AND FABRICATION METHOD OF THE SEMICONDUCTOR PACKAGE

FIELD OF THE INVENTION

The present invention relates to semiconductor packages and fabrication methods thereof, and more particularly, to a stacked multi-chip semiconductor package in which at least two chips are stacked and mounted to a chip carrier formed with an opening, and a method for fabricating the semiconductor package.

BACKGROUND OF THE INVENTION

Multi-chip semiconductor packages employ advanced packaging technology to incorporate at least two chips in a single semiconductor package, so as to desirably provide a multiplied level of functionality and data storage capacity for the semiconductor package. Such a high-integration package assembly is suitably applied to high-level electronic devices sought for improved operational and electrical performances.

Image sensor chips are light-induced chips, and an active surface (where electronic elements and circuits are formed) of the image sensor chip is operationally driven by light. Therefore, for packaging the image sensor chip, a specially structured encapsulant is utilized to allow light to reach the chip. With the chip being mounted on a chip carrier such as substrate or lead frame, an encapsulant is formed on the chip carrier around the chip to encompass a cavity for receiving the chip therein; then, a transparent lid is attached to the encapsulant and covers the cavity, so as to allow light to penetrate through the lid to reach and drive the chip. Alternatively, an encapsulant made of a transparent material can be formed on the chip carrier to encapsulate the chip, and allows the chip to receive light through the transparent encapsulant.

A multi-chip semiconductor package with an image sensor chip can be fabricated by the following processes. First, a first chip is mounted on a substrate, and a second chip or image sensor chip is stacked on the first chip. An encapsulant is formed on the substrate around the first and second chips, and encompasses a cavity for receiving the first and second chips therein. Then, a transparent lid is provided to cover the cavity, such that light can penetrate through the lid to reach and induce operation of the second chip (image sensor chip). However, this stacked multi-hip package may have relatively large structural size in consideration of combined thickness of the first and second chips, thereby making the package not effectively compact in profile.

Therefore, it would be greatly desired to provide multichip package structure incorporated with at least an image sensor chip with reduced package size.

SUMMARY OF THE INVENTION

A primary objective of the present invention is to provide a stacked multi-chip semiconductor package and a fabrication method thereof, which can incorporate an image sensor chip in multi-chip structure, so as to improve operational performances of the image sensor chip, and help reduce overall size of the semiconductor package.

In accordance with the above and other objectives, the present invention proposes a stacked multi-chip semiconductor package and a fabrication method thereof The semiconductor package comprises: a chip carrier having a first surface and a second surface opposed to the first surface, and formed with at least an opening penetrating through the chip carrier; at least a first chip received within the opening of the chip carrier; at least a second chip mounted on the second surface of the chip carrier and over the opening, and stacked on the first chip via an adhesive, a first encapsulant formed on the first surface of the chip carrier, and filling into the opening of the chip carrier for encapsulating the first chip; a second encapsulant formed on the second surface of the chip carrier around the second chip, wherein the second encapsulant encompasses a cavity for receiving the second chip within the cavity; and a lid attached to the second encapsulant for covering the cavity.

A fabrication method of the above semiconductor package comprises the steps of: preparing a chip carrier having a first surface and a second surface opposed to the first surface, wherein at least an opening is formed through the chip carrier; applying an adhesive tape on the second surface of the chip carrier and over the opening, allowing the adhesive tape to be partly exposed to the opening; mounting at least a first chip within the opening of the chip carrier, and attaching the first chip to the adhesive tape; forming a first encapsulant on the first surface of the chip carrier, the first encapsulant filling into the opening of the chip carrier for encapsulating the first chip; removing the adhesive tape from the second surface of the chip carrier; forming a second encapsulant on the second surface of the chip carrier at area outside the opening to encompass a cavity, mounting at least a second chip within the cavity on the second surface of the chip carrier and over the opening, and stacking the second chip on the first chip via an adhesive; and attaching a lid to the second encapsulant for covering the cavity.

The first chip may be a driver chip, and the second chip may be an image sensor chip. The above semiconductor package provides multi-chip package structure to stack the image sensor chip (second chip) on the driver chip (first chip) that helps drive operation of the image sensor chip, so as to improve functionality and operational performances for the package structure with the image sensor chip. Moreover, the driver chip is received within an opening formed through a chip carrier where the image sensor chip is mounted, such that overall package thickness or size would not be increased but package integration is effectively enhanced by virtue of stacked multi-chip structure, which is a significant benefit in packaging technology. Furthermore, an elastomer adhesive is used for stacking the image sensor chip on the driver chip, and thus reduces stress and delamination in the package structure during fabrication processes.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a stacked multi-chip semiconductor package and a fabrication method thereof proposed in the present invention are described in more detail as follows with reference to FIGS. 1, 2A–2E and 3A–3E.

First Preferred Embodiment

Figure 1:
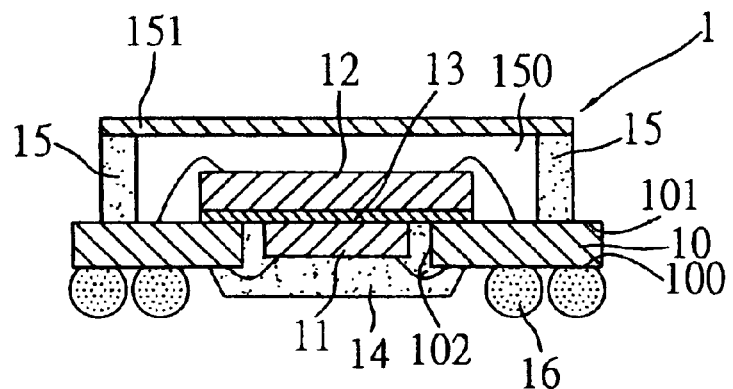
FIG. 1 is a cross-sectional view of a semiconductor package according to a first preferred embodiment of the invention.

FIG. 1 illustrates a stacked multi-chip semiconductor package 1 according to a first preferred embodiment of the invention. As shown in FIG. 1, this semiconductor package 1 is a substrate-based package, comprising: a substrate 10 having a first surface 100 and a second surface 101, and formed with at least an opening 102 penetrating through the substrate 10; at least a first chip 11 received within the opening 102 of the substrate 10; at least a second chip 12 mounted on the second surface 101 of the substrate 10 and over the opening 102, and stacked on the first chip 11 via an adhesive 13; a first encapsulant 14 formed on the first surface 100 of the substrate 10, and filling into the opening 102 of the substrate 10 for encapsulating the first chip 11; a second encapsulant 15 formed on the second surface 101 of the substrate 10 around the second chip 12, wherein the second encapsulant 15 encompasses a cavity 150 for receiving the second chip 12 within the cavity 150; a lid 151 attached to the second encapsulant 15 for covering the cavity 150; and a plurality of solder balls 16 implanted on the first surface 100 of the substrate 10 at area outside the first encapsulant 14.

The above semiconductor package 1 can be fabricated by the following process steps as shown in FIGS. 2A–2E.

Figure 2A:
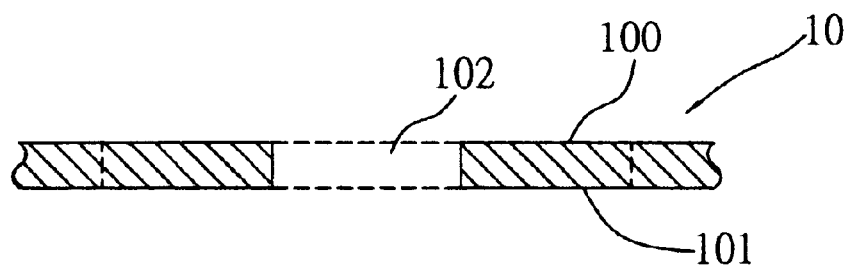
FIGS. 2A–2E are schematic diagrams showing fabrication processes for the semiconductor package shown in FIG. 1.

Referring to FIG. 2A, the first step is to prepare a substrate 10 having a first surface 100 and a second surface 101 opposed to the first surface 100. The substrate 10 is formed with an opening 102 penetrating through the first and second surfaces 100, 101. The substrate 10 is primarily made of a conventional resin material such as epoxy resin, polyimide, BT resin, FR-4 resin, etc.

Figure 2B:
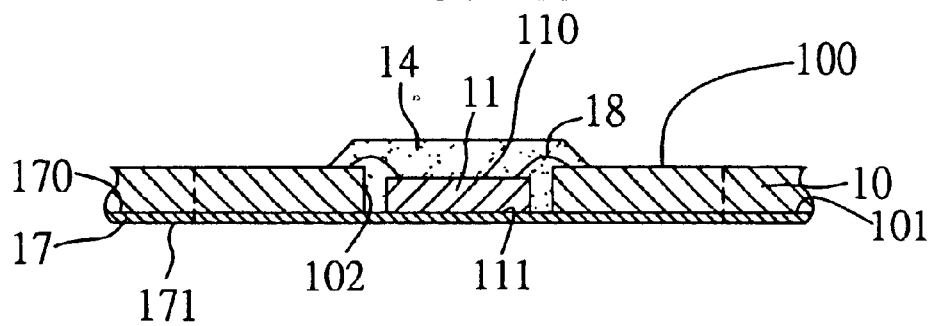

Referring to FIG. 2B, the next step is to attach an adhesive tape 17 such as a polyimide tape to the second surface 101 of the substrate 10. The adhesive tape 17 has a first surface 170 and a second surface 171 opposed to the first surface 170, and is dimensioned sufficiently to cover the opening 102 of the substrate 10, allowing the first surface 170 to be partly exposed to the opening 102.

A chip-bonding process is performed to mount a first chip 11 such as a driver chip within the opening 102 of the substrate 10 and on the first surface 170 of the adhesive tape 17. The first chip 11 has an active surface 110 formed with a plurality of electronic elements and circuits (not shown) thereon, and a non-active surface 111 opposed to the active surface 110, allowing the non-active surface 111 to be attached to the first surface 170 of the adhesive tape 17.

A wire-bonding process is performed to form a plurality of first bonding wires 18 such as gold wires; the first bonding wires 18 are bonded to the active surface 110 of the first chip 11 and to the first surface 100 of the substrate 10, to thereby electrically connect the first chip 11 to the substrate 10.

Then, a first encapsulant 14 is formed by a printing process on the first surface 100 of the substrate 10; the first encapsulant 14 fills into the opening 102 of the substrate 10 for encapsulating the first chip 11 and the first bonding wires 18.

Figure 2C:
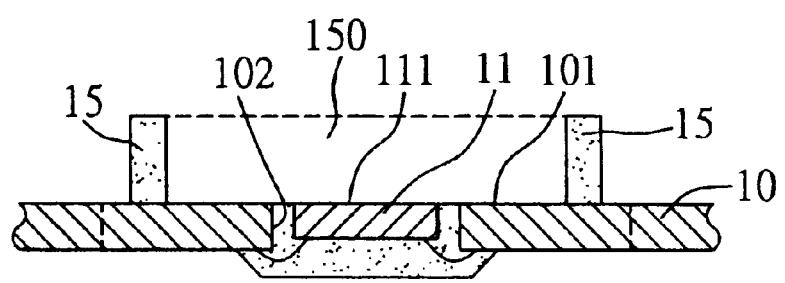

Referring to FIG. 2C, a detaping process is carried out to remove the adhesive tape 17 from the second surface 101 of the substrate 10, whereby the non-active surface 111 of the first chip 11 is exposed.

Then, the substrate 10 is turned upside down to face the non-active surface 111 of the first chip 11 and the second surface 101 of the substrate 10 upwards.

A second encapsulant 15 is formed by a molding process on the second surface 101 of the substrate 10 at area outside the opening 102 to encompass a cavity 150 for subsequently receiving another chip (not shown) therein.

Figure 2D:
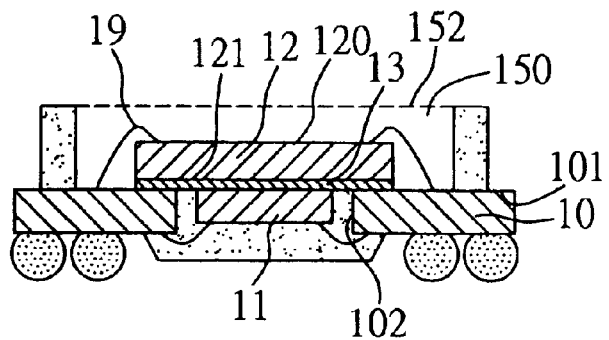

Referring to FIG. 2D, an adhesive 13 is applied by a dispensing process on the second surface 101 of the substrate 10 and over the opening 102 and the non-active surface 111 of the first chip 11; the adhesive 13 may be an epoxy adhesive, and preferably made of elastomer.

A chip-bonding process is performed to mount a second chip 12 such as an image sensor chip on the adhesive 13, to thereby receive the second chip 12 within the cavity 150 and stack the second chip 12 on the first chip 11. The second chip 12 has an active surface 120 formed with electronic elements and circuits (not shown) thereon, and a non-active surface 121 opposed to the active surface 120, wherein the non-active surface 121 is attached to the adhesive 13, and the active surface 120 of the second chip 12 faces upwards toward an opening 152 of the cavity 150.

Then, a wire-bonding process is performed to form a plurality of second bonding wires 19 such as gold wires within the cavity 150, and bond the second bonding wires 19 to the active surface 120 of the second chip 12 and the second surface 101 of the substrate 10, so as to electrically connect the second chip 12 to the substrate 10 by means of the second bonding wires 19.

Figure 2E:
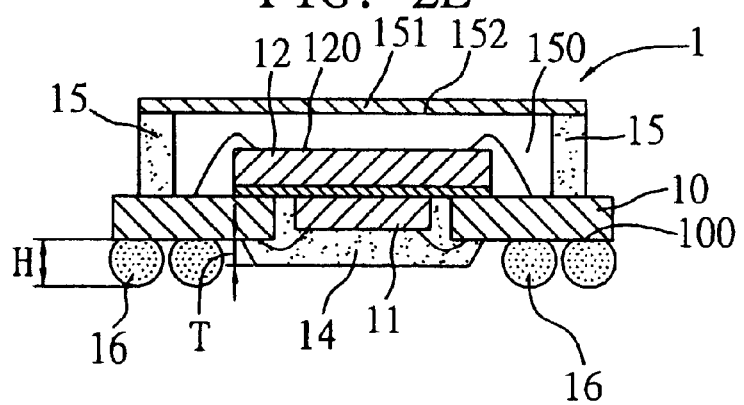

Referring to FIG. 2E, a lid 151 is prepared and attached to the second encapsulant 15 for covering the opening 152 of the cavity 150. The lid 151 is preferably transparent to allow light to reach the active surface 120 of the second chip 12 (image sensor chip).

Finally, a plurality of solder balls 16 are implanted on the first surface 100 of the substrate 10 at area outside the first encapsulant 14. Height 1-1 of the solder balls 16 is greater than thickness T of the first encapsulant 14 protruding from the first surface 100 of the substrate 10. The solder balls 16 serve as I/O (input/output) ports to electrically connect the first and second chips 11, 12 to an external device such as a printed circuit board (not shown). Alternatively, a plurality of solder columns (not shown) instead of solder balls 16 can be printed on the first surface 100 of the substrate 10 to act as I/O ports for the semiconductor package 1. This thereby completes fabrication of the semiconductor package 1.

Second Preferred Embodiment

FIGS. 3A–3E illustrate fabrication processes for a semiconductor package 2 according to a second preferred embodiment of the invention. This semiconductor package 2 differs from the above semiconductor package 1 of the first embodiment in that the semiconductor package 2 uses a lead frame as a chip carrier.

Figure 3A:
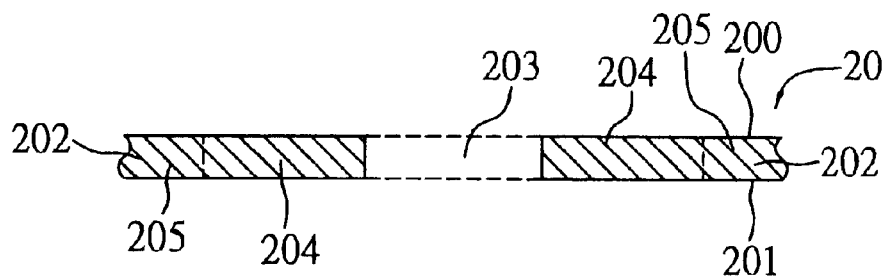
FIGS. 3A–3E are schematic diagrams showing fabrication processes for a semiconductor package according to a second preferred embodiment of the invention.

Referring to FIG. 3A, the first step is to prepare a lead frame 20 having a first surface 200 and a second surface 201 opposed to the first surface 200. The lead frame 20 is formed with a plurality of leads 202 encompassing an opening 203, and each of the leads 202 is composed of an inner lead 204 and an outer lead 205.

Figure 3B:
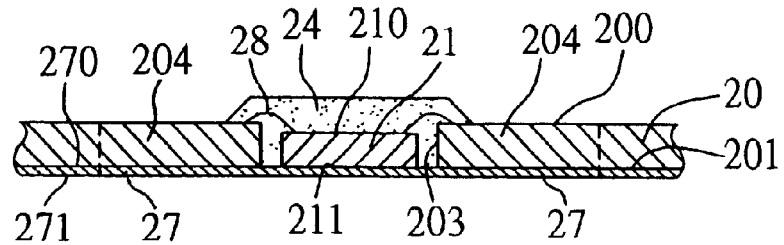

Referring to FIG. 3B, the next step is to apply an adhesive tape 27 on the second surface 201 of the lead frame 20 and over the opening 203. The adhesive tape 27 has a first surface 270 and a second surface 271 opposed to the first surface 270, allowing the first surface 270 to be partly exposed to the opening 203.

Then, a first chip 21 is mounted within the opening 203 of the lead frame 20. The first chip 21 has an active surface 210 and a non-active surface 211 opposed to the active surface 210, allowing the non-active surface 211 to be attached to the first surface 270 of the adhesive tape 27. A plurality of first bonding wires 28 are formed and bonded to the active surface 210 of the first chip 21 and to the first surface 200 of the inner leads 204, to thereby electrically connect the first chip 21 to the lead frame 20. A first encapsulant 24 is formed on the first surface 200 of the inner leads 204, and fills into the opening 203 of the lead frame 20 for encapsulating the first chip 21 and the first bonding wires 28.

Figure 3C:
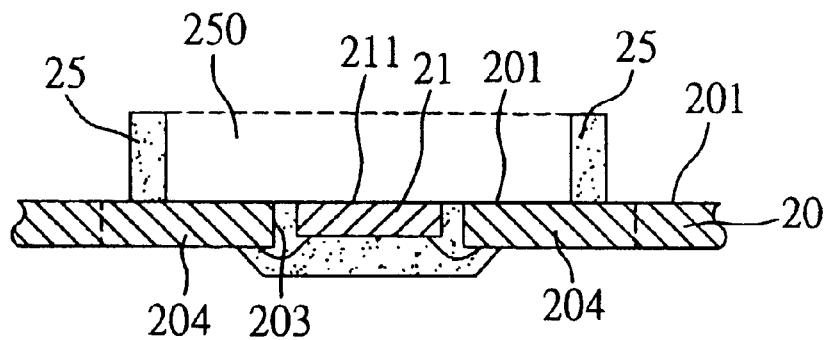

Referring to FIG. 3C, the adhesive tape 27 is removed from the second surface 201 of the lead frame 20 to expose the non-active surface 211 of the first chip 21. Then, the lead frame 20 is turned upside down to face the non-active surface 211 of the first chip 21 and the second surface 201 of the lead frame 20 upwards. A second encapsulant 25 is formed on the second surface 201 of the inner leads 204 at area outside the opening 203 to encompass a cavity 250 for subsequently receiving another chip (not shown) therein.

Figure 3D:
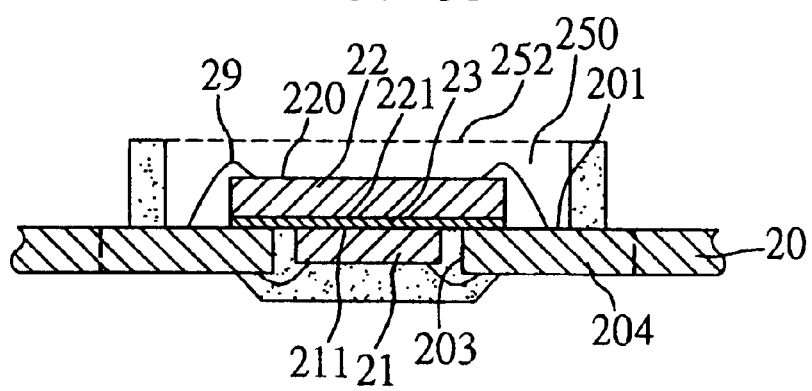

Referring to FIG. 3D, an adhesive 23 is applied on the second surface 201 of the inner leads 204 and over the opening 203 and the non-active surface 211 of the first chip 21. Then, a second chip 22 is mounted on the adhesive 23 and stacked on the first chip 21 to be received within the cavity 250. The second chip 22 has an active surface 220 and a non-active surface 221 opposed to the active surface 220, wherein the non-active surface 221 is attached to the adhesive 23, and the active surface 220 of the second chip 22 faces upwards toward an opening 252 of the cavity 250. A plurality of second bonding wires 29 are formed within the cavity 250, and bonded to the active surface 220 of the second chip 22 and the second surface 201 of the inner leads 204, to thereby electrically connect the second chip 22 to the lead frame 20.

Figure 3E:
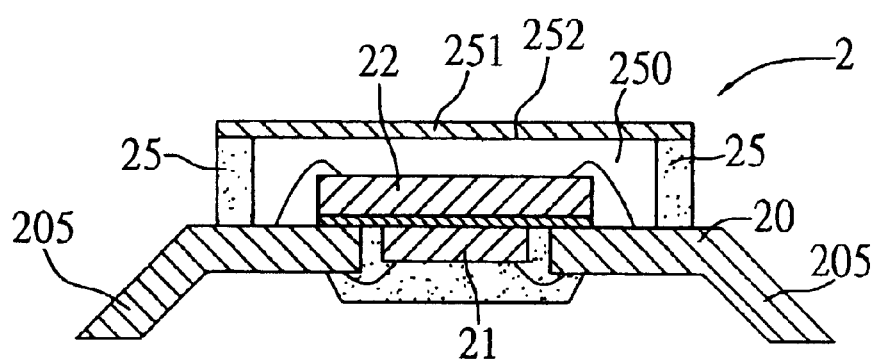

Finally, referring to FIG. 3E, a lid 251 is attached to the second encapsulant 25 for covering the opening 252 of the cavity 250. The outer leads 205 of the lead frame 20 may be deformed or bent to be bonded to an external device such as a printed circuit board (not shown), and serve as I/O (input/output) ports to electrically connect the first and second chips 21, 22 to the external device. This thereby completes fabrication of the semiconductor package 2.

The above semiconductor packages 1, 2 provide multi-chip package structure to stack an image sensor chip (second chip) on a driver chip (first chip) that helps drive operation of the image sensor chip, so as to improve functionality and operational performances for the package structure with the image sensor chip. Moreover, the driver chip is received within an opening formed through a chip carrier where the image sensor chip is mounted, such that overall package thickness or size would not be increased but package integration is effectively enhanced by virtue of stacked multi-chip structure, which is a significant benefit in packaging technology. Furthermore, an elastomer adhesive is used for stacking the image sensor chip on the driver chip, and thus reduces stress and delamination in the package structure during fabrication processes.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:
1. A stacked multi-chip semiconductor package, comprising:
   a chip carrier having a first surface and a second surface opposed to the first surface, and formed with at least an opening penetrating through the chip carrier;
   at least a first chip received within the opening of the chip carrier, and electrically connected to the chip carrier, wherein the first chip has a thickness not larger than the thickness of the chip carrier between the first and second surface thereon;
   at least a second chip mounted on the second surface of the chip carrier and over the opening and stacked on the first chip via an adhesive, the second chip being electrically connected to the chip carrier, wherein the second chip has a thickness larger than the thickness of the first chip and a width larger than the width of the opening in the chip carrier such that the second chip simultaneously contacts both the first chip and the chip carrier;
   a first encapsulant formed on the first surface of the chip carrier, and filling into the opening of the chip carrier for encapsulating the first chip;
   a second encapsulant formed on the second surface of the chip carrier around the second chip, wherein the second encapsulant encompasses a cavity for receiving the second chip within the cavity; and
   a lid attached to the second encapsulant for covering the cavity.

2. The semiconductor package of claim 1, wherein the first chip has an active surface and a non-active surface opposed to the active surface, the active surface being electrically connected to the first surface of the chip carrier by a plurality of bonding wires, and the non-active surface being attached to the second chip.

3. The semiconductor package of claim 1, wherein the second chip has an active surface and a non-active surface opposed to the active surface, the active surface facing toward the lid and being electrically connected to the second surface of the chip carrier by a plurality of bonding wires, and the non-active surface being attached to the first chip.

4. The semiconductor package of claim 3, wherein the second chip is an image sensor chip, and the lid is transparent.

5. The semiconductor package of claim 1, wherein the adhesive is made of elastomer.

6. The semiconductor package of claim 1, wherein the chip carrier is a substrate.

7. The semiconductor package of claim 6, further comprising: a plurality of solder balls implanted on the first surface of the substrate at area outside the first encapsulant.

8. The semiconductor package of claim 6, further comprising: a plurality of solder columns printed on the first surface of the substrate at area outside the first encapsulant.

9. The semiconductor package of claim 1, wherein the chip carrier is a lead frame formed with a plurality of leads encompassing the opening.

10. The semiconductor package of claim 9, wherein the first chip is received within the opening encompassed by the leads, and the second chip is mounted on the leads within the cavity encompassed by the second encapsulant formed on the leads.

11. A fabrication method of a stacked multi-chip semiconductor package, comprising the steps of:
   preparing a chip carrier having a first surface and a second surface opposed to the first surface, wherein at least an opening is formed through the chip carrier;

applying an adhesive tape on the second surface of the chip carrier and over the opening, allowing the adhesive tape to be partly exposed to the opening;

mounting at least a first chip within the opening of the chip carrier, and attaching the first chip to the adhesive tape, the first chip being electrically connected to the chip carrier, wherein the first chip has a thickness not larger than the thickness of the chip carrier between the first and second surface thereon;

forming a first encapsulant on the first surface of the chip carrier, the first encapsulant filling into the opening of the chip carrier for encapsulating the first chip;

removing the adhesive tape from the second surface of the chip carrier;

forming a second encapsulant on the second surface of the chip carrier at area outside the opening to encompass a cavity;

mounting at least a second chip within the cavity on the second surface of the chip carrier and over the opening, and stacking the second chip on the first chip via an adhesive, the second chip being electrically connected to the chip carrier, wherein the second chip has a thickness larger than the thickness of the first chip and a width larger than the width of the opening in the chip carrier such that the second chip simultaneously contacts both the first chip and the chip carrier; and attaching a lid to the second encapsulant for covering the cavity.

12. The fabrication method of claim 11, wherein the first chip has an active surface and a non-active surface opposed to the active surface, the active surface being electrically connected to the first surface of the chip carrier by a plurality of bonding wires, and the non-active surface being attached to the second chip.

13. The fabrication method of claim 11, wherein the second chip has an active surface arid a non-active surface opposed to the active surface, the active surface facing toward the lid and being electrically connected to the second surface of the chip carrier by a plurality of bonding wires, and the non-active surface being attached to the first chip.

14. The fabrication method of claim 13, wherein the second chip is an image sensor chip, and the lid is transparent.

15. The fabrication method of claim 11, wherein the adhesive is made of elastomer.

16. The fabrication method of claim 11, wherein the chip carrier is a substrate.

17. The fabrication method of claim 16, further comprising a step to implanting a plurality of solder balls on the first surface of the substrate at area outside the first encapsulant.

18. The fabrication method of claim 16, further comprising a step of:

printing a plurality of solder columns on the first surface of the substrate at area outside the first encapsulant.

19. The fabrication method of claim 11, wherein the chip carrier is a lead frame formed with a plurality of leads encompassing the opening.

20. The fabrication method of claim 19, wherein the first chip is received within the opening encompassed by the leads, and the second chip is mounted on the leads within the cavity encompassed by the second encapsulant formed on the leads.

* * * * *